United States Patent
Yoo et al.

(10) Patent No.: US 9,601,205 B2
(45) Date of Patent: Mar. 21, 2017

(54) STORAGE DEVICE AND METHOD OF WRITING AND READING THE SAME

(71) Applicants: Younggeon Yoo, Seoul (KR); Junjin Kong, Yongin-si (KR); Hong Rak Son, Anyang-si (KR)

(72) Inventors: Younggeon Yoo, Seoul (KR); Junjin Kong, Yongin-si (KR); Hong Rak Son, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 195 days.

(21) Appl. No.: 14/297,093

(22) Filed: Jun. 5, 2014

(65) Prior Publication Data

US 2015/0006791 A1    Jan. 1, 2015

(30) Foreign Application Priority Data

Jul. 1, 2013    (KR) .................. 10-2013-0076608

(51) Int. Cl.
| | |
|---|---|
| *G06F 12/02* | (2006.01) |
| *G11C 16/10* | (2006.01) |
| *G06F 11/10* | (2006.01) |
| *G11C 11/56* | (2006.01) |
| *G11C 16/04* | (2006.01) |

(52) U.S. Cl.
CPC .......... *G11C 16/10* (2013.01); *G06F 11/1072* (2013.01); *G11C 11/5628* (2013.01); *G11C 16/0483* (2013.01)

(58) Field of Classification Search
CPC ....... G11C 16/06; G11C 16/10; G11C 16/105; G06F 12/0246; G06F 2212/7207
USPC ......................................................... 711/103
See application file for complete search history.

(56) References Cited

U.S. PATENT DOCUMENTS

| | | | |
|---|---|---|---|
| 7,177,974 B2 | 2/2007 | Egner et al. | |
| 7,529,142 B2 | 5/2009 | Widdershoven | |
| 8,004,891 B2 | 8/2011 | Kim et al. | |

(Continued)

OTHER PUBLICATIONS

Yaakobi, Eitan et al. "Multiple Error-Correcting WOM-Codes", 2012, IEEE Transactions on Information Theory, vol. 58, pp. 1-11.

(Continued)

*Primary Examiner* — Gary Portka
(74) *Attorney, Agent, or Firm* — Harness, Dickey & Pierce, P.L.C.

(57) ABSTRACT

A write method of a storage device including at least one nonvolatile memory device and a memory controller controlling the nonvolatile memory device includes dividing write data into a plurality of page data groups, each page data group including multiple bits of data; encoding the divided page data groups using different binary codes, respectively; mapping the encoded page data groups; programming, in first memory cells connected to one word line, programming states to which binary values of each of the mapped encoded page data groups are mapped, such that, the plurality of page data groups correspond respectively to a plurality of read voltage levels, and for each of the plurality of page data groups, the page data group can be read by performing a single read operation on the first memory cells using the read voltage level corresponding to the page data group.

20 Claims, 19 Drawing Sheets

(56) References Cited

U.S. PATENT DOCUMENTS

| | | |
|---|---|---|
| 8,014,196 B2 | 9/2011 | Graef |
| 8,055,972 B2 | 11/2011 | Lasser |
| 8,055,979 B2 | 11/2011 | Wu et al. |
| 8,176,234 B2 | 5/2012 | Franceschini et al. |
| 8,176,235 B2 | 5/2012 | Franceschini et al. |
| 8,321,760 B2 | 11/2012 | Son et al. |
| 8,411,510 B2 | 4/2013 | Son et al. |
| 8,432,735 B2 | 4/2013 | Kim et al. |
| 8,716,234 B2 | 5/2014 | Baker et al. |
| 2008/0168215 A1 | 7/2008 | Jiang et al. |
| 2010/0202198 A1 | 8/2010 | Kim et al. |
| 2011/0194347 A1 | 8/2011 | Chae |
| 2012/0054416 A1 | 3/2012 | Kobayashi et al. |
| 2012/0096234 A1 | 4/2012 | Jiang et al. |
| 2012/0268988 A1 | 10/2012 | Seol et al. |
| 2013/0205073 A1* | 8/2013 | Hwang .................. G11C 16/10 711/103 |
| 2013/0343125 A1* | 12/2013 | Gillingham ......... G11C 11/5628 365/185.03 |
| 2014/0173174 A1* | 6/2014 | Frickey ............... G11C 11/5628 711/103 |
| 2014/0258590 A1* | 9/2014 | Kochar ............... G06F 12/0246 711/103 |
| 2014/0328123 A1* | 11/2014 | Birk ....................... G11C 16/10 365/185.03 |

OTHER PUBLICATIONS

Yaakobi, Eitan et al. "Codes for Write-Once Memories", 2012, IEEE Transactions on Information Theory, vol. 58, No. 9, pp. 1-15.
Shpilka, Amir "Capacity Achieving Multiwrite WOM Codes", 2012, Isreal Institute of Technology, pp. 1-14.

* cited by examiner

STORAGE DEVICE AND METHOD OF WRITING AND READING THE SAME

CROSS-REFERENCE TO RELATED APPLICATIONS

This U.S. non-provisional patent application claims priority under 35 U.S.C. §119 of Korean Patent Application No. 10-2013-0076608, filed on Jul. 1, 2013, the entire contents of which are hereby incorporated by reference.

BACKGROUND

At least some embodiments of the inventive concepts herein relates to a storage device improving read performance and a method of writing and reading the storage device.

A semiconductor memory device can be classified into a volatile memory device such as a DRAM, a SRAM, etc. and a nonvolatile memory device such as an EEPROM, a FRAM, a PRAM, a MRAM, a flash memory, etc. A volatile memory device loses its stored data when its power supply is interrupted but a nonvolatile memory device retains its stored data even when its power supply is interrupted. A flash memory has advantages of a high speed programming, low power consumption and a large amount of data storage capacity. Thus, a data storage device based on a flash memory is being widely used. Examples of a data storage device based on a flash memory include a solid state drive (SSD) replacing a conventional hard disk and a memory card such as a SD card and a MMC.

SUMMARY

A write method of a storage device including at least one nonvolatile memory device and a memory controller controlling the nonvolatile memory device, the method comprising: dividing write data into a plurality of page data groups, each page data group including multiple bits of data; encoding the divided page data groups using different binary codes, respectively; mapping the encoded page data groups by, for each of the encoded page data groups, mapping binary values of the encoded page data group to two programming states, respectively, the two programming states corresponding to the binary code used to encode the encoded page data group; and programming, in first memory cells connected to one word line, the programming states to which the binary values of each of the mapped encoded page data groups are mapped, such that, the plurality of page data groups correspond respectively to a plurality of read voltage levels, and for each of the plurality of page data groups, the page data group can be read by performing a single read operation on the first memory cells using the read voltage level corresponding to the page data group.

A read method of a storage device including at least one nonvolatile memory device and a memory controller controlling the nonvolatile memory device includes reading data from a plurality of memory cells connected to one word line by using a single read voltage level in the nonvolatile memory device, wherein the plurality of memory cells store a plurality of page data groups as a result of a multi bit programming operation corresponding to different binary codes, the multi bit programming operation having been performed on each of a plurality of code units, each code unit including multiple memory cells from among the plurality of memory cells, each code unit including different memory cells; decoding the read data using a binary code, from among the different binary codes, that corresponds to the single read voltage level; and outputting the decoded data one of the plurality of page data groups in the memory controller.

A read method of a storage device including at least one nonvolatile memory device and a memory controller controlling the nonvolatile memory device includes sequentially reading a plurality of page data groups by using a plurality of single read voltage levels of the nonvolatile memory device, respectively, wherein a plurality of memory cells connected to one word line store the plurality of page data groups as a result of a multi bit programming operation corresponding to different binary codes, the multi bit programming operation having been performed on each of a plurality of code units, each code unit including multiple memory cells from among the plurality of memory cells, each code unit including different memory cells; performing a demapping operation on the page data groups by sequentially demapping, to encoded page data units, programming states corresponding to the page data groups, the encoded page data units including binary values, the demapping operation being performed for each page data group based on the single read voltage level corresponding to each page data group; sequentially decoding the demapped page data groups using corresponding ones of the different binary codes, respectively; and sequentially correcting one or more errors of the decoded page data groups using one or more error correction codes.

A storage device includes at least one nonvolatile memory device including a plurality of memory cells; and a memory controller configured to, perform a write operation by perform a multi-page program operation on first memory cells, from among the plurality of memory cells, connected to one word line such that each of the first memory cells holds one of a plurality of programming states that corresponds to a portion at least two different pages of data simultaneously, and perform a read operation by controlling the nonvolatile memory device to perform a page read operation on any one of at least two pages by using a single read voltage level.

A method of programming a nonvolatile memory device includes performing a programming operation including programming a first page data group and a second page data group into a plurality of memory cells of the nonvolatile memory device such that, after performing the programming operation, programming states of each of the plurality of memory cells correspond to at least a portion of data of the first page data group and at least a portion of data of the second page data group, simultaneously.

The performing the programming operation may further include programming the first page data group and the second page data group into a plurality of memory cells of the nonvolatile memory device such that, after performing the programming operation, all the data of the first page data group can be read from the plurality of memory cells by applying a single read voltage of a first level to each of the plurality of memory cells, and all the data of the second page data group can be read from the plurality of memory cells by applying a single read voltage of a second level to each of the plurality of memory cells, the first and second levels being different.

BRIEF DESCRIPTION OF THE FIGURES

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION

Figure 1:
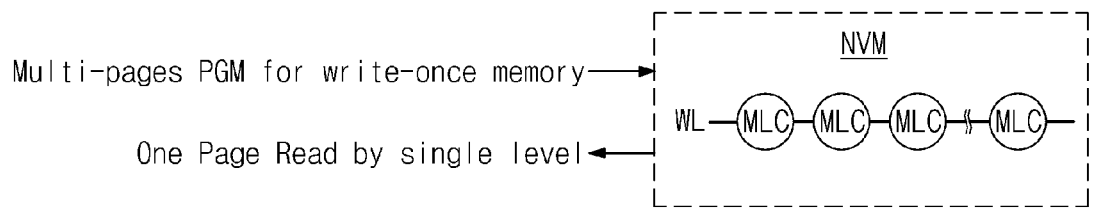
FIG. 1 is a drawing for roughly describing the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved. FIG. 1 is a drawing for roughly describing the inventive concepts. Referring to FIG. 1, a nonvolatile memory device NVM is embodied to perform a multi-page program operation so that at least a part of the nonvolatile memory device NVM is used as a write-once memory (WOM) and perform one page read operation by a single level. The WOM is a memory which is used without erasing stored data. The multi-page program operation according to at least some embodiments of the inventive concepts makes memory cells MLCs connected to one word line WL store a plurality of pages. The multi-page program operation according to at least some embodiments of the inventive concepts makes each of the pages perform a read operation by a single level. Each of the memory cells is a multi-level cell (MLC) storing one or more bits.

Although the nonvolatile memory device NVM is constituted by multi-level cells MLCs each storing two or more bits, it can output data by only one read operation. Thus, at least some embodiments of inventive concepts can improve random read performance requiring a high-speed read operation.

The nonvolatile memory device NVM may be a NAND flash memory, a vertical NAND flash (VNAND), a NOR flash memory, a resistive random access memory (RRAM), a phase change RAM (PRAM), a magnetoresistive RAM (MRAM), a ferroelectric RAM (FRAM), a spin transfer torque RAM (STT-RAM), etc. The nonvolatile memory device NVM can be embodied by a three-dimensional array structure. At least some embodiments of the inventive concepts can be applied to not only a flash memory device of which a charge storage layer is constituted by a conductive floating gate, but also a charge trap flash (CTF) of which a charge storage layer is constituted by an insulating layer. For explanation purposes, it will be assumed that the nonvolatile memory device NVM is a NAND flash memory device.

Figure 2:
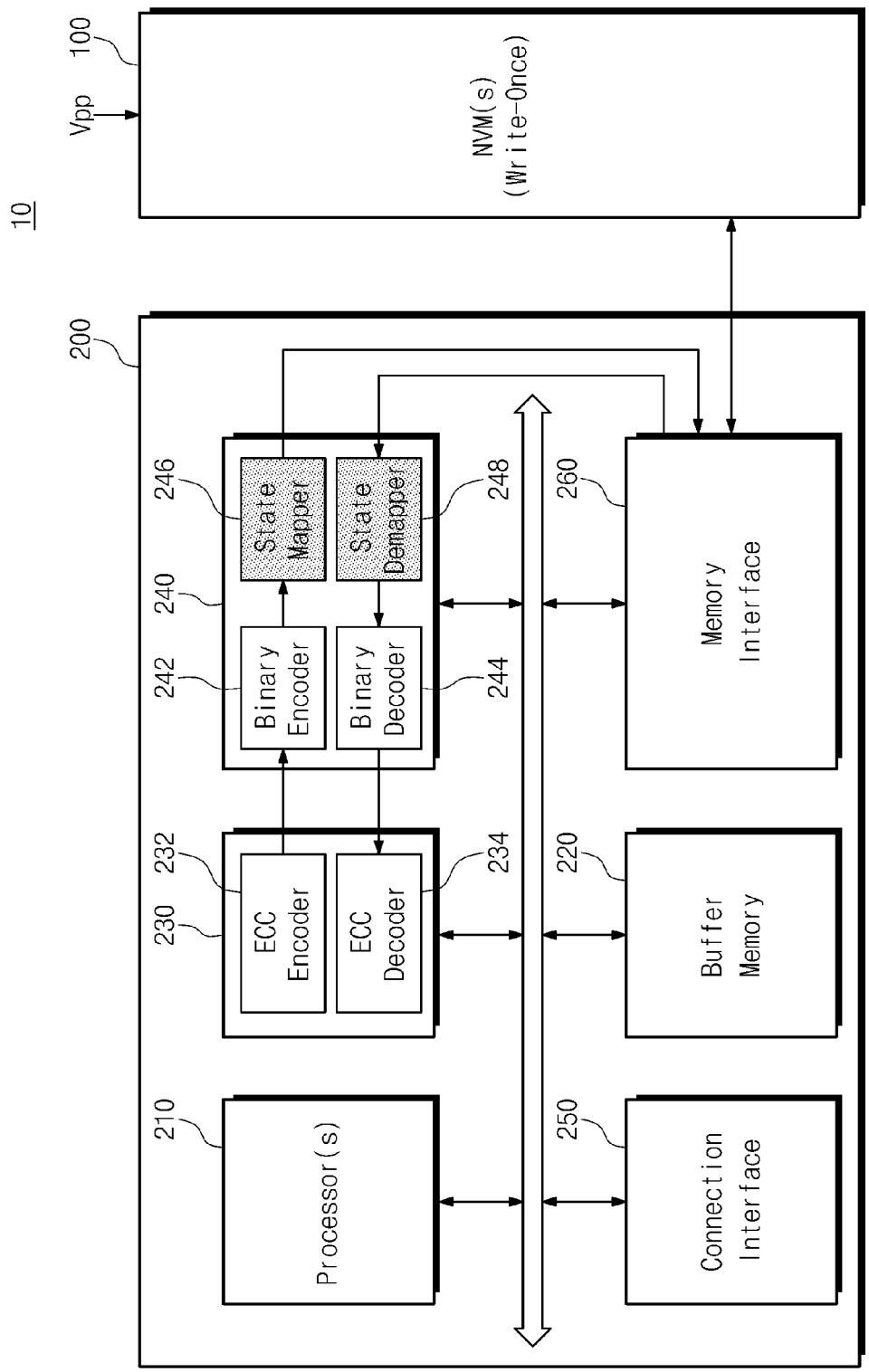
FIG. 2 is a block diagram illustrating a storage device in accordance with some embodiments of the inventive concepts.

FIG. 2 is a block diagram illustrating a storage device 10 in accordance with some embodiments of the inventive concepts. Referring to FIG. 2, a storage device 10 includes at least one nonvolatile memory device 100 and a memory controller 200 controlling the nonvolatile memory device 100.

The nonvolatile memory device 100 includes a plurality of memory blocks including memory cells storing data. The nonvolatile memory device 100 can be optionally embodied to be provided with a high voltage Vpp from an external source.

The memory controller 200 is connected to the nonvolatile memory device 100 through at least one channel. The memory controller 200 includes at least one processor 210, a buffer memory 220, an error correction circuit 230, a code circuit 240, a connection interface 250 and a memory interface 260.

The processor 210 controls the whole operation of the storage device 10.

The buffer memory 220 temporarily stores data needed for a processing operation of the processor 210. The buffer memory 220 can temporarily store data (write data) received from an external source when a write operation is performed to program the data in the nonvolatile memory device 100. The buffer memory 220 can temporarily store data (read data) read from the nonvolatile memory device 100 when a read operation is performed to output the data to an external destination.

The error correction circuit 230 includes an error correction code (ECC) encoder 232 and an ECC decoder 234. The ECC encoder 232 receives write data from the buffer memory 220, calculates an error correction code value corresponding to the write data using an error correction code and outputs write data including the error correction code value to the code circuit 240. The ECC decoder 234 receives read data including the error correction code value from the code circuit 240 to correct an error of the read data using an error correction code.

Although not illustrated in the drawing, the storage device 10 can further include a code memory storing code data needed to drive the memory controller 200. The code memory can be embodied by a nonvolatile memory device (e.g., PRAM, MRAM, etc.). The code memory can use a part of the nonvolatile memory device 100.

The code circuit 240 can modulate and demodulate write/read data using a binary code so that at least a part of the nonvolatile memory device 100 is used as a write once memory (WOM). The WOM is a memory the stored data of which is not erased. The binary code is an encoding code that can make page data stored in memory cells (i.e., a page) connected to one word line several times. The binary code may be a WOM code (or a multiwrite binary WOM code).

The code circuit 240 can code write data including an error correction code value using a binary code so that one page read operation is performed by a single level or can decode data read in the one page read operation by a single level using a binary code. The decoded read data includes the error correction code value.

The code circuit 240 includes a binary encoder 242, a binary decoder 244, a state mapper 246 and a state demapper 248.

The binary encoder 242 can receive write data including an error correction code value from the ECC encoder 232 to encode the received write data using a binary code. The received write data may be one page data.

The binary decoder 244 can receive read data including an error correction code value from the state demapper 248 to decode the received read data using a binary code. The decoded read data may be one page data.

The state mapper 246 can map the write data coded by the binary encoder 242 in states suitable for a page to be written. The page to be written is a page selected among a plurality of pages that can be stored in memory cells connected to one word line when a write operation is performed. Each of the pages related to one word line stores write data coded by a different binary code value. The state mapper 246 can determine states of cells storing page data on the basis of page information.

The state demapper 248 can demap data read by performing a read operation on one page among a plurality of pages related to one word line by a single level in states suitable for the page read.

In FIG. 2, the code circuit 240 is located in the back of the error correction circuit 230. However, at least some example embodiments of the inventive concepts are not limited to this example. The code circuit of according to at least some embodiments of the inventive concepts may be located in front of the error correction circuit 230.

The connection interface 250 can provide an interface function with an external device (host). The connection interface 250 can be embodied by at least one of various interfaces including, for example, USB, SCSI, ESDI, SATA, SATAe, SAS, PCI, PCIe, MMC, IDE, MIPI, PPN, etc. The connection interface 250 receives write data from an external source when a write operation is performed, transmits the received data to the buffer memory 230 and receives error corrected read data from the buffer memory 230 when a read operation is performed.

The memory interface 260 can provide an interface function with the nonvolatile memory device 100. The memory interface 260 receives data to be written from the code circuit 240 when a write operation is performed and receives page data read from the nonvolatile memory device 100 when a read operation is performed.

The storage device 10 can store data in memory cells several times without an erase operation using a binary code to delay an erase operation or not to perform an erase operation. As a result, at least some embodiments of the inventive concepts can delay or reduce deterioration of memory cells caused by an erase operation.

A conventional storage device may have to perform a read operation 1.5 times (2 bit MLC: 1.5 times, 3 bit MLC: 2.3 times, 4 bit MLC: 3.75 times) on average to read page data stored in multi-level cells MLCs. The storage device 10 of the inventive concepts can read page data by a single level by storing page data using a binary code. Thus, the storage device 10 can greatly improve read performance as compared with a conventional storage device.

Figure 3:
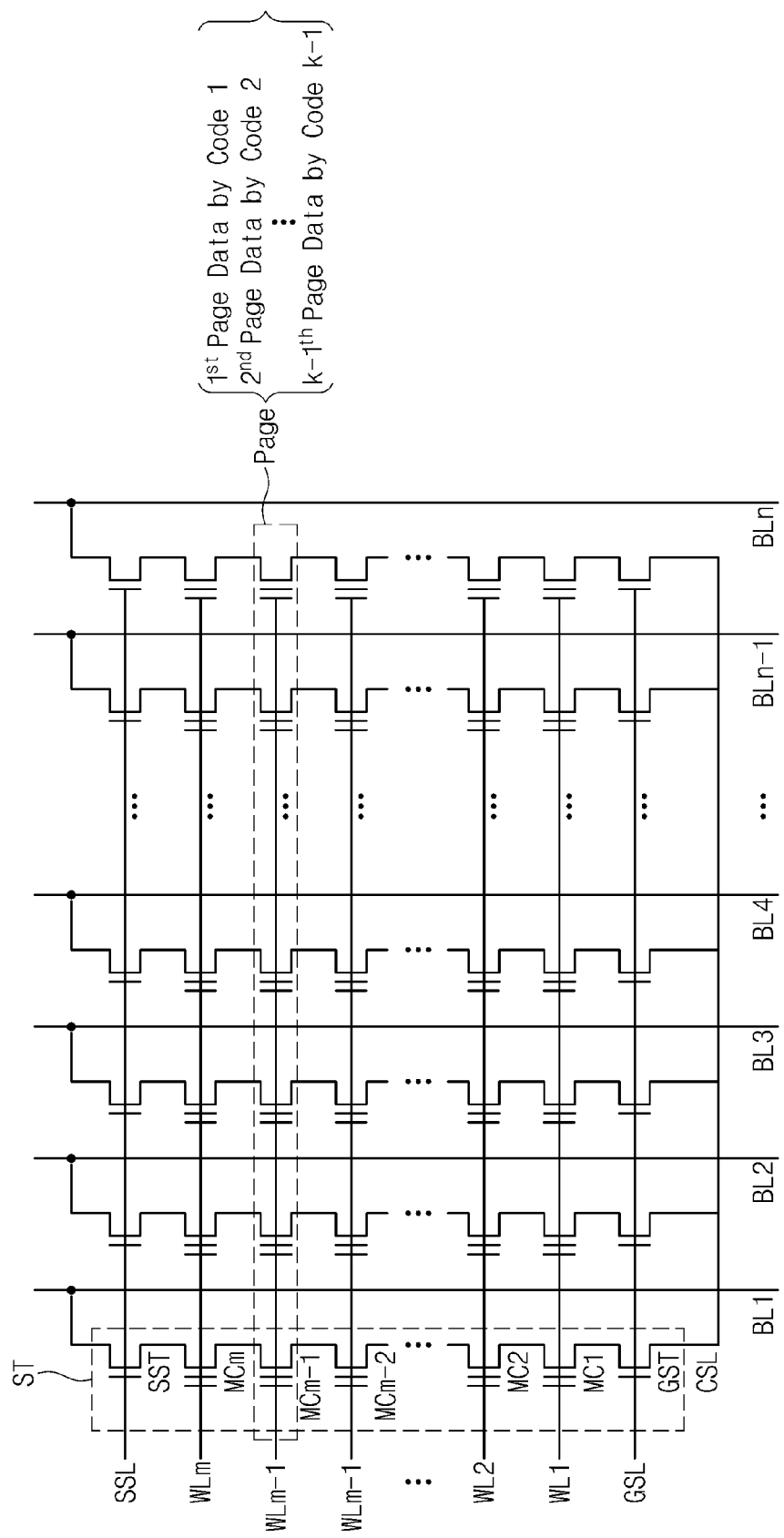
FIG. 3 is a drawing illustrating an embodiment of a memory block of a nonvolatile memory device illustrated in FIG. 2.

FIG. 3 is a drawing illustrating an embodiment of a memory block of a nonvolatile memory device 100 illustrated in FIG. 2. Referring to FIG. 3, the memory block has a NAND flash memory structure. The memory block is constituted by a plurality of memory cells disposed between word lines WL1~WLm (m is an integer of two or more) and bit lines BL1~BLn (n is an integer of two or more).

The memory block includes a string ST connected to each of the bit lines BL1~BLn. A string ST, as illustrated in FIG. 2, includes at least one string select transistor SST connected between a bit line and a common select line CSL, a plurality of memory cells MC1~MCm (m is an integer of two or more) and at least one ground select transistor GST.

Memory cells connected to one word line (e.g., WLm−1) are called a page. A page in accordance with some embodiments of the inventive concepts can store k−1 groups of page data (k is an integer of three or more). The k may be less than the maximum number of threshold voltage states that can be embodied in one memory cell. Each page data group may be coded or state-mapped according to a different binary code value. For example, first page data group is coded or state-mapped according to a first binary code (code 1), the second page data group is coded or state-mapped according to a second binary code (code 2) and the k−1th page data group is coded or state-mapped according to a k−1th binary code (code k−1).

The page in accordance with some embodiments of the inventive concepts can store a plurality of page data groups corresponding to different binary codes.

Figure 4:
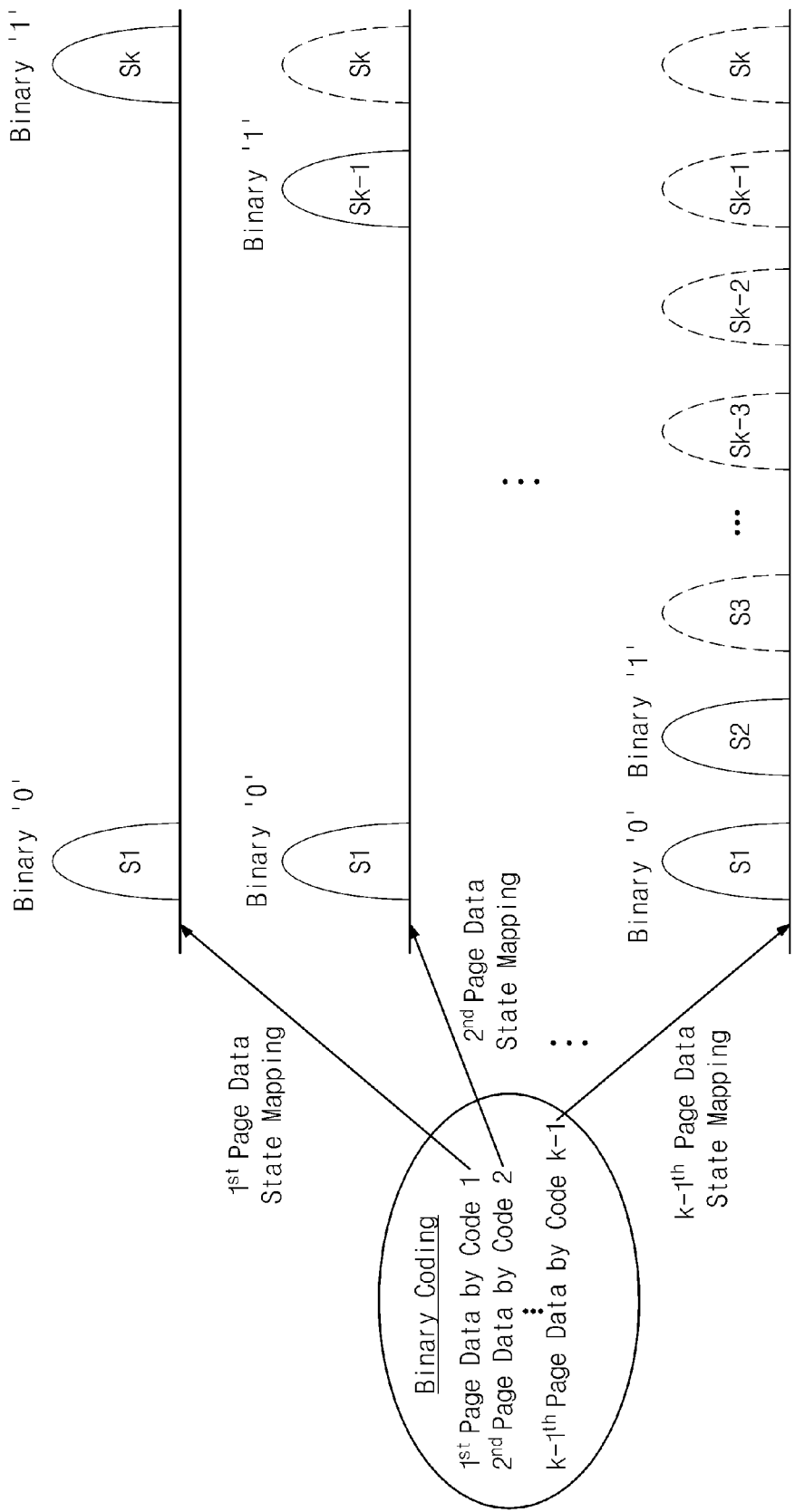
FIG. 4 is a drawing for describing a state mapping process being performed in a state mapper illustrated in FIG. 2.

FIG. 4 is a drawing for describing a state mapping process being performed in a state mapper illustrated in FIG. 2. As illustrated in FIG. 4, it is assumed that a memory cell is programmed in any one of k number of states for storing data.

A state mapping of first page data coded by a first binary code (code 1) may use a first state S1 and a kth state Sk. For example, a binary '0' of the first page data group is mapped in the first state S1, that is, the lowest state and a binary '1' of the first page data group is mapped to the kth state Sk, that is, the highest state.

A state mapping of second page data group coded by a second binary code (code 2) may use a first state S1 and a k−1th state Sk−1. For example, a binary '0' of the second page data group is mapped in the first state S1, that is, the lowest state and a binary '1' of the second page data is mapped to the k−1th state Sk−1. The k−1 the state is lower than the highest state Sk.

A binary '1' of the second page data group can be mapped to a kth state Sk considering a state mapping of other page data groups. For example, when storing a binary '1' of the second page data in a memory cell in which a binary '1' of the first page data group is stored, the binary '1' of the second page data group is mapped to the kth state Sk. This is to restore the binary '1' of the first page data group and the binary '1' of the second page data group that are stored in a memory cell.

A state mapping of k−1th page data group coded by a k−1th binary code (code k−1) may use a first state S1 and a second state S2. For example, a binary '0' of the k−1th page data group is mapped in the first state S1, that is, the lowest state and a binary '1' of the k−1th page data group is mapped to the second state S2. The k−1 the state is lower than the highest state Sk.

A binary '1' of the k−1th page data group can be mapped to any one of a third state S3 through a kth state Sk considering a state mapping of other page data group. For example, when storing a binary '1' of the k−1th page data group in a memory cell in which a binary '1' of the first page data group is stored, the binary '1' of the k−1th page data group is mapped to the kth state Sk. This is to restore the binary '1' of the first page data group and the binary '1' of the k−1th page data group that are stored in a memory cell.

In FIG. 4, the lowest state S1 is mapped to a binary '0' and the other states S2~Sk are mapped to a binary '1'. However, at least some example embodiments of the inventive concepts are not limited to this example. The lowest state S1 may be mapped to a binary '1' and the other states S2~Sk may be mapped to a binary '0'.

A state mapping of each page data group is embodied to distinguish each page data group by a single level.

Figure 5:
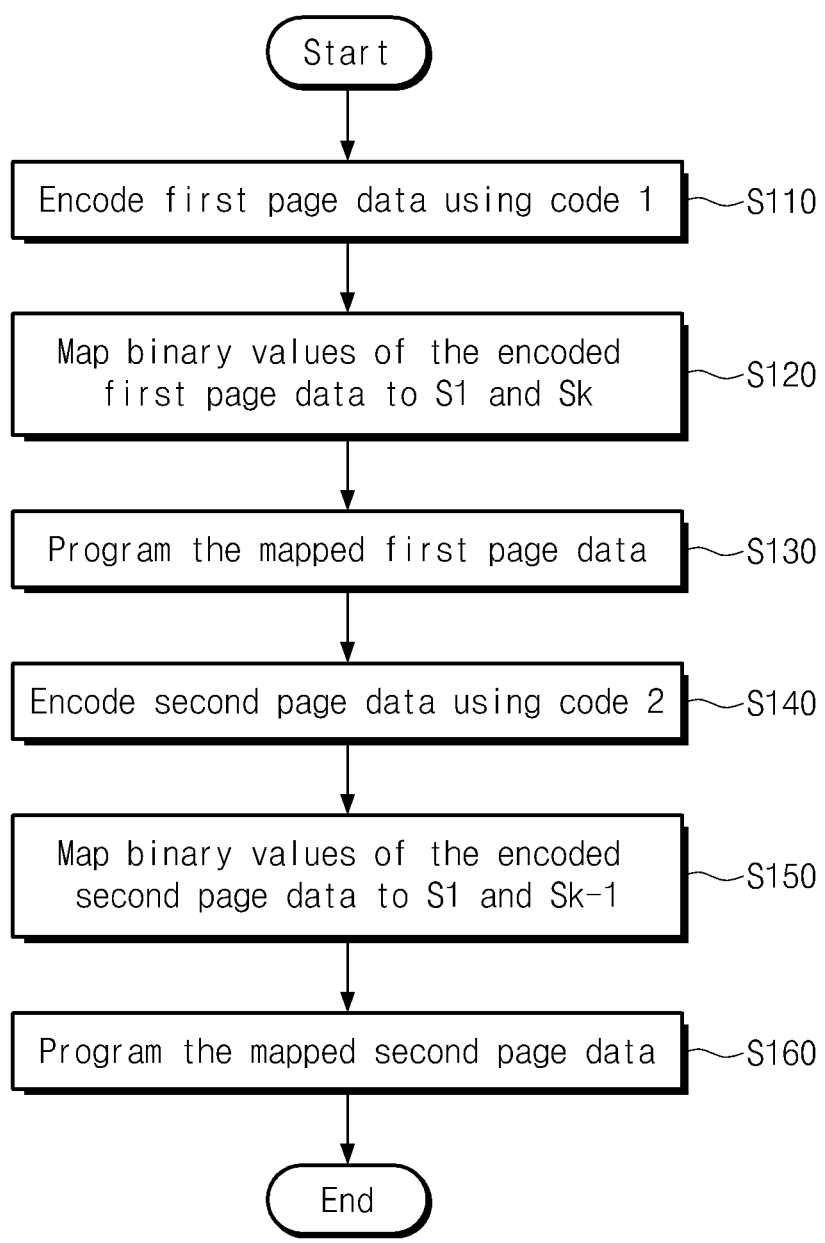
FIG. 5 is a flow chart illustrating a first embodiment for a write method of a storage device in accordance with some embodiments of the inventive concepts.

FIG. 5 is a flow chart illustrating a first embodiment for a write method of a storage device in accordance with some embodiments of the inventive concepts. Referring to FIGS. 1 through 5, a write method of a storage device is as follows. For explanation purposes, a program method of two page data group will be described.

The binary encoder 242 of the code circuit 240 encodes first page data group using a first binary code Code 1 (S110). The first page can include an error correction code value. The state mapper 246 of the code circuit 240 maps binary values of the encoded first page data group to corresponding two states (a first state S1 and a second state Sk) (S120). The second state Sk may be the highest state as illustrated in FIG. 4. The nonvolatile memory device 100 receives mapped first page data group from the memory controller 200 and programs the mapped first page data group (S130).

The binary encoder 242 of the code circuit 240 encodes second page data group using a second binary code Code 2 (S140). The state mapper 246 of the code circuit 240 maps binary values of the encoded second page data group to corresponding first state S1 and a third state Sk−1 (S150). The third state Sk−1 may be lower than the second state Sk as illustrated in FIG. 4. The nonvolatile memory device 100 receives mapped second page data group from the memory controller 200 to program the mapped second page data group (S160).

In a write method of the storage device in accordance with some embodiments of the inventive concepts, page data group is encoded by a binary code, binary values of the encoded page data group are mapped to predetermined states and the mapped page data group is programmed.

In FIG. 5, after programming mapped first page data group, mapped second page data group is programmed. However, at least some embodiments of the inventive concepts are not limited to this example. In a program method according to at least some embodiments of the inventive concepts, a plurality of mapped page data group can be programmed at a time.

Figure 6:
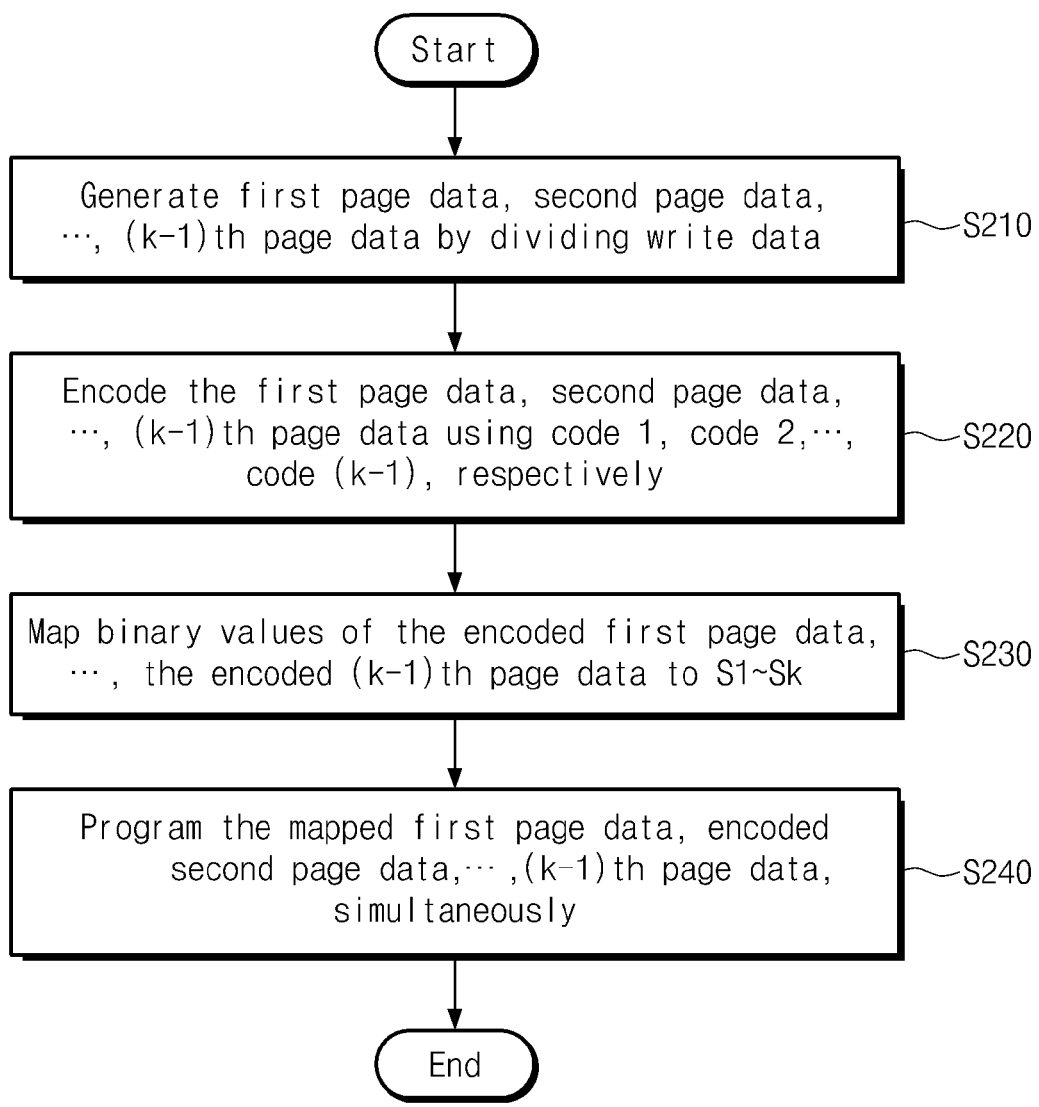
FIG. 6 is a flow chart illustrating a second embodiment for a write method of a storage device in accordance with some embodiments of the inventive concepts.

FIG. 6 is a flow chart illustrating a second embodiment for a write method of a storage device in accordance with some embodiments of the inventive concepts. Referring to FIGS. 1 through 4 and 6, a write method of the storage device is as follows.

The memory controller 200 divides write data to be programmed in the nonvolatile memory device 100 to generate a plurality of page data group (S210). Each of the page data group may be page data group including an error correction code value.

The binary encoder 242 of the code circuit 240 performs an encoding operation on the page data group using binary codes corresponding to respective page data group (S220). The state mapper 246 of the code circuit 240, as illustrated in FIG. 3, maps binary values of the encoded page data group to corresponding states (S230). The nonvolatile memory device 100 receives program data corresponding to the mapped page data group to program the received program data. That is, the mapped page data group is programmed simultaneously (S240).

In a write method of the storage device in accordance with some embodiments of the inventive concepts, a plurality of page data group is encoded by a binary code, binary values of the encoded page data group are mapped to corresponding states and the mapped page data group is programmed at a time.

Figure 7:
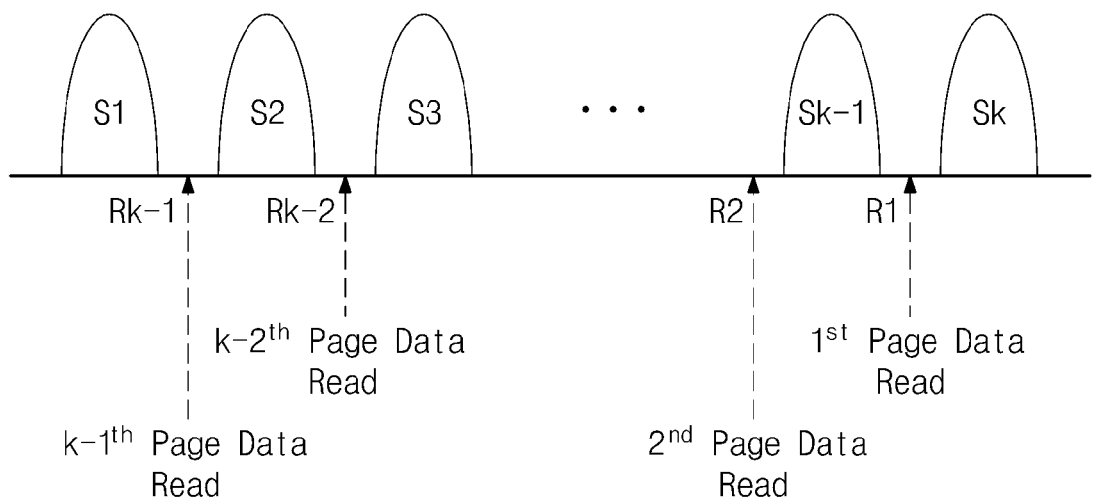
FIG. 7 is a drawing illustrating a read operation of a storage device in accordance with some embodiments of the inventive concepts.

FIG. 7 is a drawing illustrating a read operation of a storage device in accordance with some embodiments of the inventive concepts. For explanation purposes, it will be assumed that as illustrated in FIG. 4, page data group is mapped and first and k−1th page data group are programmed accordingly. Referring to FIGS. 1 through 4 and 7, a first page data group read operation is performed using a first read level R1, a second page data group read operation is performed using a second read level R2 and a k−1th page data group read operation is performed using a k−1th read level Rk−1. Read levels R1~Rk−1 are determined by a page to be read.

A read operation of the storage device in accordance with some embodiments of the inventive concepts can read page data group using a single level.

Figure 8:
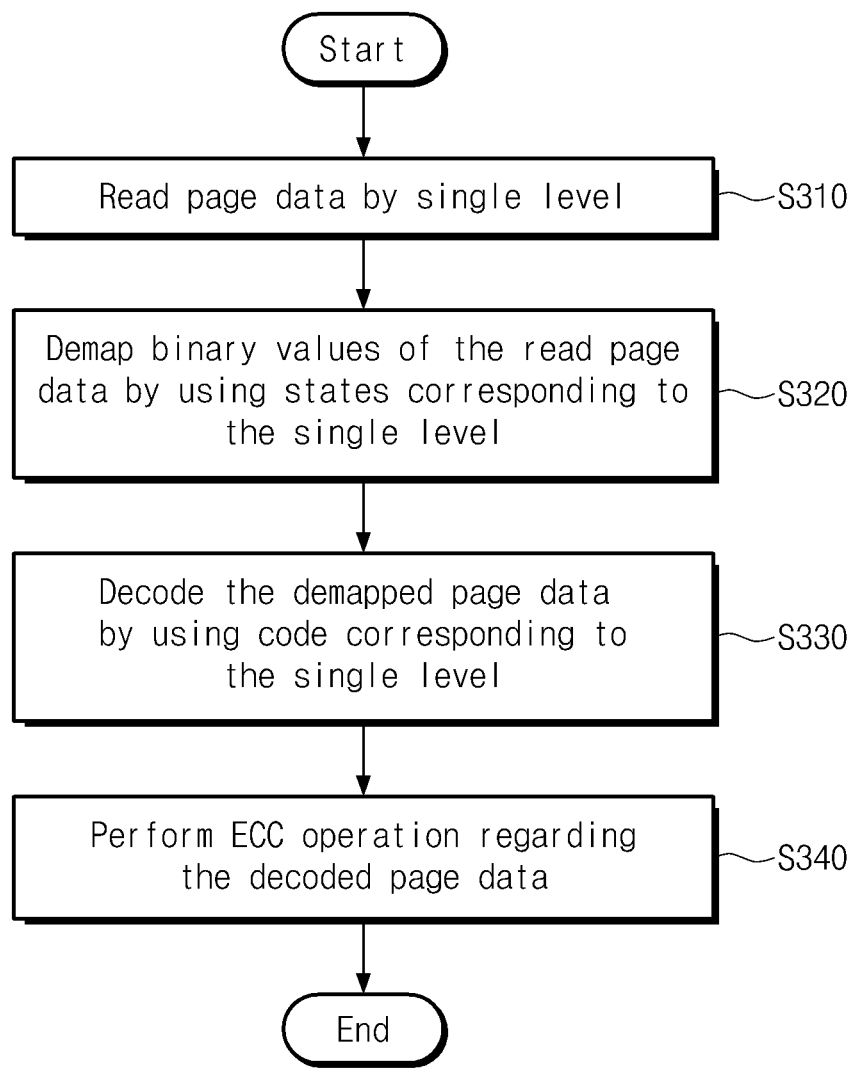
FIG. 8 is a flow chart illustrating a first embodiment for a read method of a storage device in accordance with some embodiments of the inventive concepts.

FIG. 8 is a flow chart illustrating a first embodiment for a read method of a storage device in accordance with some embodiments of the inventive concepts. Referring to FIGS. 1 through 4 and FIGS. 7 and 8, a read method of the storage device is as follows. Herein, a read operation is performed on one page.

Page data group is read by a single level corresponding to a page read from the nonvolatile memory device 100 (S310). The read data is input to the state demapper 248 of the code circuit 240 through the memory interface 260 of the memory controller 200. The demapper 248 demaps binary values of the read page data group using states corresponding to a single level (S320). The decoder 244 of the code circuit 240 decodes demapped page data group using a binary code corresponding to a single level (S330). The ECC decoder 232 of the error correction circuit 230 corrects errors of the decoded page data group using an error correction code (S340). By performing the process described above, a read operation regarding the page data group is completed.

In a read method of the storage device in accordance with some embodiments of the inventive concepts, page data group is read by a binary code, binary values corresponding to the read page data group are demapped and the demapped page data group is decoded using a binary code.

The read method illustrated in FIG. 8 can be applied to a random read operation. The read method of the storage device according to at least some embodiments of the inventive concepts can be applied to a sequential read operation.

Figure 9:
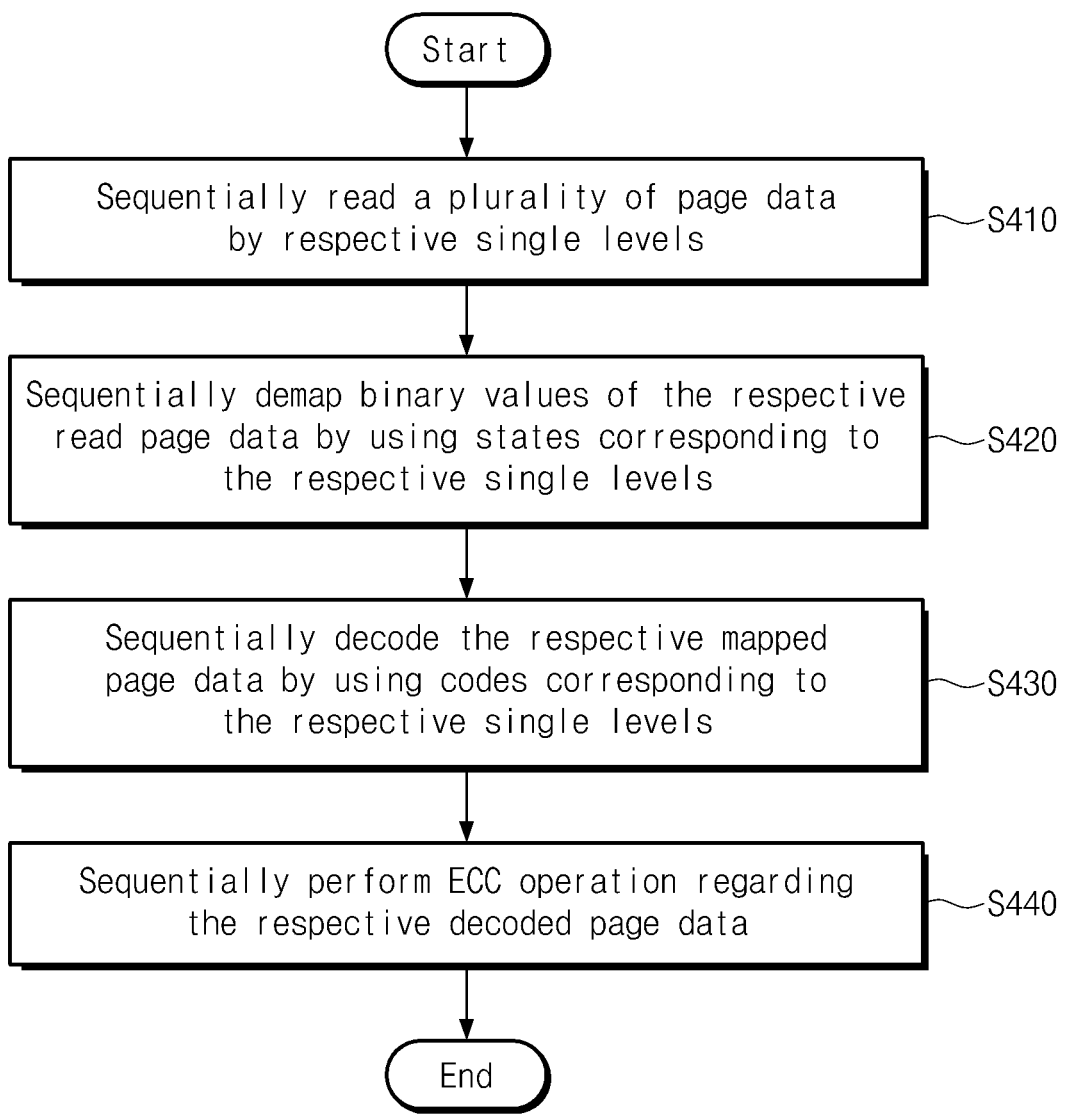
FIG. 9 is a flow chart illustrating a second embodiment for a read method of a storage device in accordance with some embodiments of the inventive concepts.

FIG. 9 is a flow chart illustrating a second embodiment for a read method of a storage device in accordance with some embodiments of the inventive concepts. Referring to FIGS. 1 through 4 and FIGS. 7 and 9, a read method of the storage device is as follows. Herein, the read operation is performed on a plurality of pages corresponding to one word line.

The nonvolatile memory device 100, as illustrated in FIG. 7, sequentially reads a plurality of page data group by respective single levels R1, R2, . . . , Rk−1 (S410). The page data group sequentially read is sequentially input to the state demapper 248 of the code circuit 240 through the memory interface 260 of the memory controller 200. The state demapper 248 sequentially demaps binary values of the read page data group using states corresponding to respective single levels (S420). The decoder 244 of the code circuit 240 sequentially decodes the demapped page data group using binary codes corresponding to respective single levels (S430). The ECC decoder 232 of the error correction circuit 230 sequentially corrects errors of the decoded page data group using respective error correction codes (S440). By performing the process described above, a read operation including the entire page data group is completed.

In the storage device in accordance with some embodiments of the inventive concepts, a sequential read operation (or a pipeline read operation) can be performed by sequentially reading page data group, sequentially demapping binary values of the read page data group and sequentially decoding the demapped page data group using respective binary codes.

In the data modulation program method of the storage device of the inventive concepts, from the viewpoint of the nonvolatile memory device, the reference or, alternatively, predetermined bit program operations is performed on every reference or, alternatively, predetermined memory cell several times.

Figure 10:
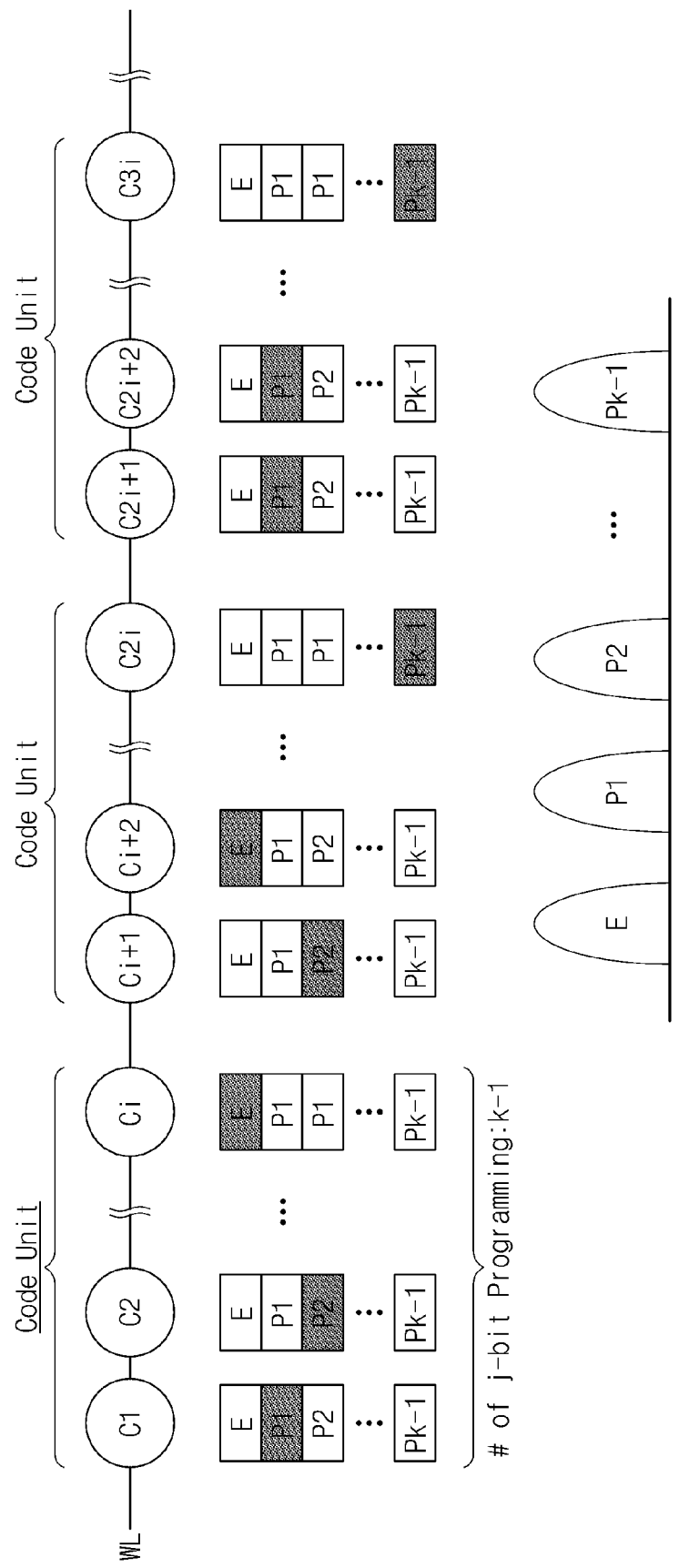
FIG. 10 is a drawing for describing a concept of a program method of a nonvolatile memory device in accordance with some embodiments of the inventive concepts.

FIG. 10 is a drawing for describing a concept of a program method of a nonvolatile memory device in accordance with some embodiments of the inventive concepts. As illustrated in FIG. 10, each of memory cells C1~C3i are programmed in either one of an erase state E and program states P1~Pk−1 (k is an integer of three or more). Referring to FIG. 10, k−1 number of j-bit programming operations (i.e., (k−1)*j/i-bit MLC programming) are performed on every cell (e.g., C1, C2, . . . , Ci) continuously connected to one word line WL, that is, on every code unit. Here, j is an integer smaller than i. The j-bit programming operations are performed according to different coding methods and correspond to respective pages being stored in the word line WL.

3-State Embodiment

At least some example embodiments of the inventive concepts perform a j-bit programming operation on every code unit several times according to different coding methods. For explanation purposes, it will be assumed that a code unit of the inventive concepts is constituted by three memory cells, each of the memory cells is programmed in either one of three states and two 2-bit programming (1.33-bit MLC programming) is performed on every three memory cells.

Figure 11:
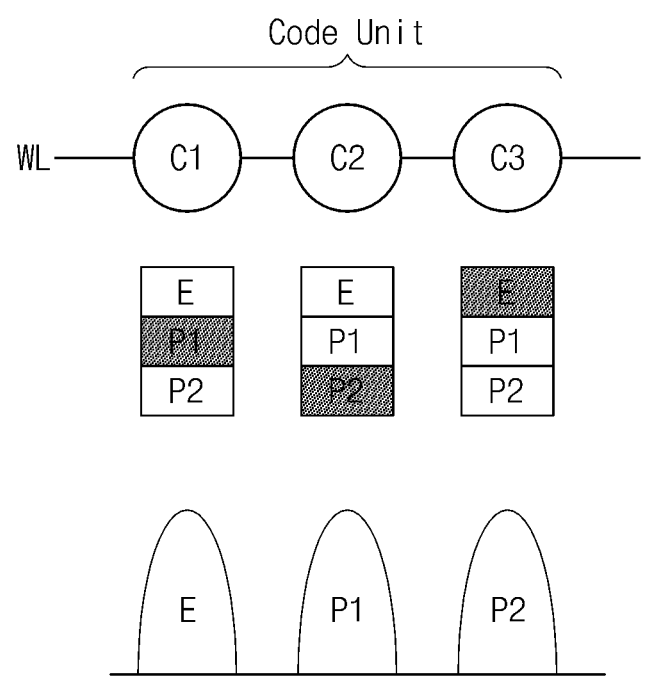
FIG. 11 is a drawing illustrating a code unit constituted by three memory cells.

FIG. 11 is a drawing illustrating a code unit constituted by three memory cells. Referring to FIG. 11, each of memory cells C1, C2 and C3 is programmed in one of an erase state E, a first program state P1 and a second program state P2. For example, as illustrated in FIG. 11, the first memory cell C1 may be programmed in the first program state P1, the second memory cell C2 may be programmed in the second program state P2 and the third memory cell C3 may be programmed in the erase state E. The inventive concepts can read out what information is stored in the code unit by decoding states of the three memory cells C1, C2 and C3 constituting the code unit according to binary codes.

Figure 12:
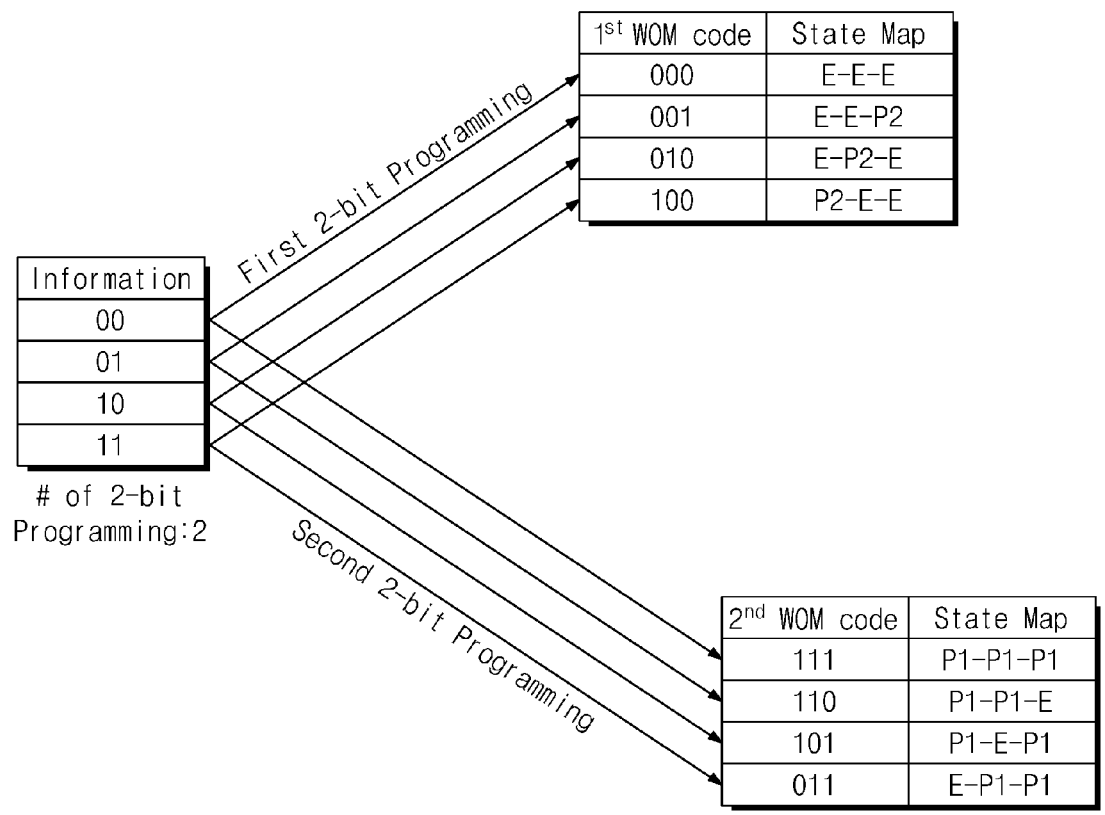
FIG. 12 is a drawing illustrating two different 2 bit programming operations being performed at every code unit.

FIG. 12 is a drawing illustrating two different 2 bit programming operations being performed at every code unit. Referring to FIGS. 10 through 12, in a first 2-bit programming operation, information is coded by a first WOM code, a binary '0' of the coded data is mapped to an erase state E and a binary '1' of the coded data is mapped to a second program state P2. According to the first WOM code, the data unit "00" is encoded to the data unit "000", the data unit "01" is encoded to the data unit "001", the data unit "10" is encoded to the data unit "010" and the data unit "11"

is encoded to the data unit "100". Thus, the first 2-bit programming can store 2-bit information by programming memory cells C1, C2 and C3 constituting a code unit in an erase state E or a second program state P2.

In a second 2-bit programming, information is coded by a second WOM code, a binary '0' of the coded data is mapped to an erase state E and a binary '1' of the coded data is mapped to a first program state P1. According to the second WOM code, the data unit "00" is encoded to the data unit "111", the data unit "01" is encoded to the data unit "110", the data unit "10" is encoded to the data unit "101" and the data unit "11" is encoded to the data unit "011". Thus, the second 2-bit programming can store 2-bit information by programming memory cells C1, C2 and C3 constituting a code unit in an erase state E or a first program state P1.

After the first 2-bit programming is completed at every code unit, the second 2-bit programming can begin.

In another embodiment, the first 2-bit programming and the second 2-bit programming can simultaneously proceed at every code unit.

Further, as is discussed in greater detail below with respect to FIG. 13, when a 2-bit data unit being programmed into a code unit of three memory cell in the first programming operation matches the 2-bit data unit being programmed into the same code unit in the second programming operation, the second programming operation may include maintaining the program states programmed into the code unit during the first programming operation.

Figure 13:
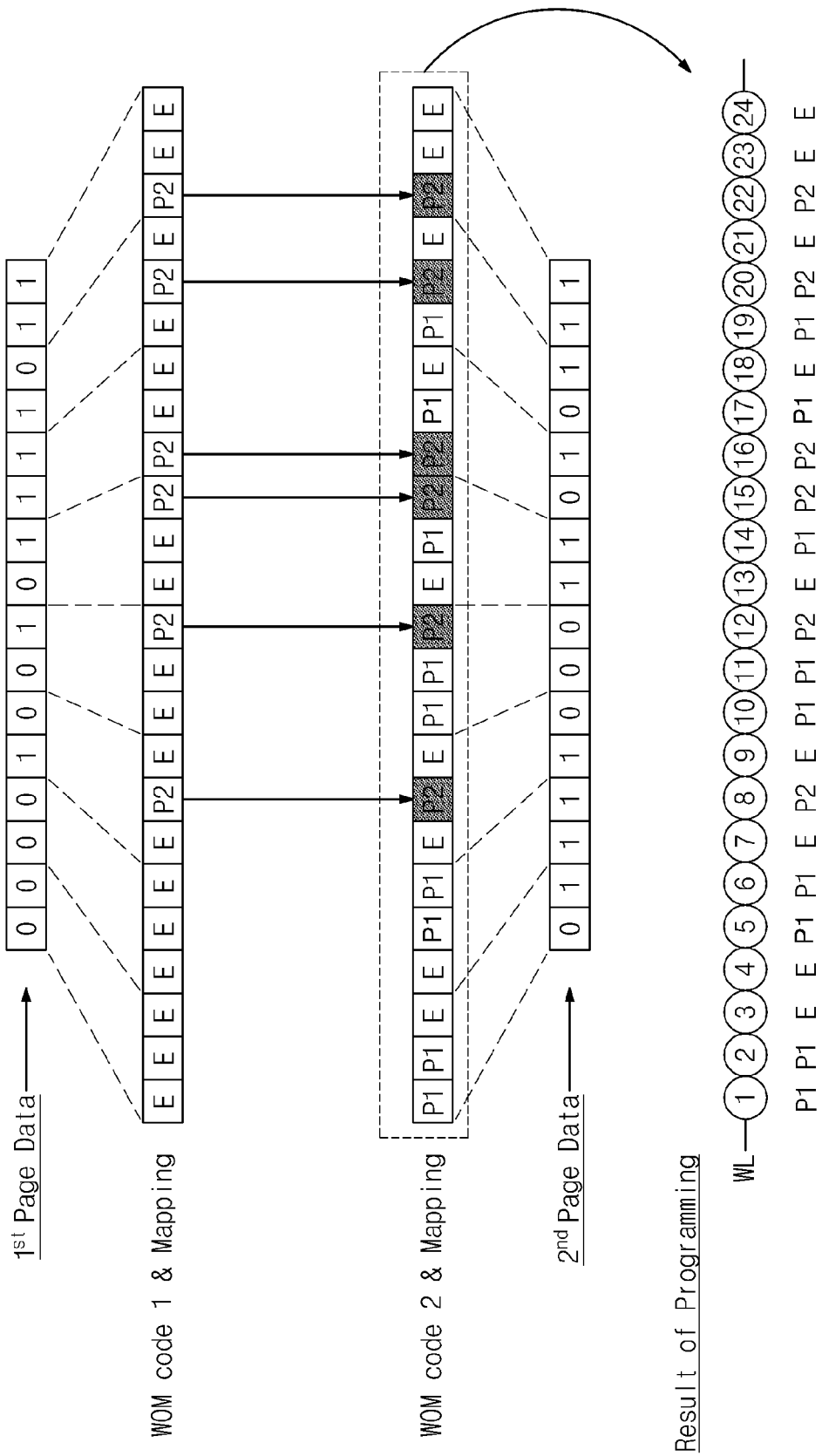
FIG. 13 is a drawing illustrating an embodiment for a program operation in accordance with a coding method and a mapping method illustrated in FIG. 12.

FIG. 13 is a drawing illustrating an embodiment for a program operation in accordance with a coding method and a mapping method illustrated in FIG. 12. In FIG. 13, for explanation purposes, it will be assumed that first and second page data groups to be programmed are 16 bit data.

If the first page data group to be programmed is "0000100101111011", the code circuit 240 encodes the first page data group using the first WOM code, and then maps the encoded 24 bit first page data group to "E-E-E-E-E-E-E-E-P2-E-E-E-P2-P2-E-E-E-P2-E-P2-E-E" using the erase state E and the second program state P2.

If the second page data group to be programmed is "0111100011010111", the code circuit 240 encodes the second page data group using the second WOM code, and then maps the encoded 24 bit second page data group to "P1-P1-E-E-P1-P1-E-P2-E-P1-P1-P2-E-P1-P2-P2-P1-E-P1-P2-E-P2-E-E" using the erase state E, the first program state P1 and the second program state P2. A memory cell mapped to the second program state P2 in the mapping of the first page data group may retain the second program state P2 in the mapping of the second page data group. Further, as is illustrated in FIG. 13, for the code unit including cells 7, 8 and 9, the 2-bit data unit in the $1^{st}$ page data group (i.e., "10") is the same as the 2-bit data unit in the $2^{nd}$ page data group (i.e., "10"). Consequently, in the second programming operation, the program states programmed into cells 7, 8 and 9 during the first programming operation (E, P2, and E) are maintained. The same can be seen in FIG. 13 with respect to the code unit including cells 22, 23 and 24.

Thus, if programming first and second page data group in twenty four memory cells 1~24 connected to a word line WL, final states of the memory cells become "P1-P1-E-E-P1-P1-E-P2-E-P1-P1-P2-E-P1-P2-P2-P1-E-P1-P2-E-P2-E-E".

That is, if programming the twenty four memory cells in states of "P1-P1-E-E-P1-P1-E-P2-E-P1-P1-P2-E-P1-P2-P2-P1-E-P1-P2-E-P2-E-E", first page data group of "0000100101111011" and second page data group of "0111100011010111" are stored in the twenty four memory cells 1~24.

Figure 14:
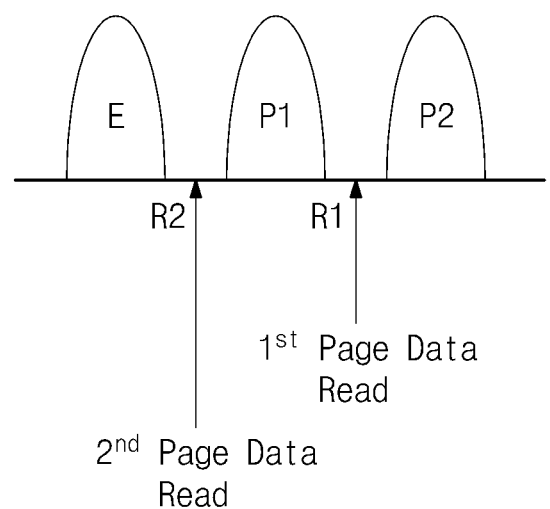
FIG. 14 is a drawing for describing performance of a single level read operation at every code unit according to some embodiments of the inventive concepts.

FIG. 14 is a drawing for describing performance of a single level read operation at every code unit according to some embodiments of the inventive concepts. As described in FIGS. 12 and 13, 2-bit data of the first and second page data group is programmed in every code unit. Referring to FIG. 14, a first page data group read operation is performed on the basis of a first read voltage R1 between the first program state P1 and the second program state P2 and a second page data group read operation is performed on the basis of a second read voltage R2 between the erase state E and the first program state P1.

Figure 15:
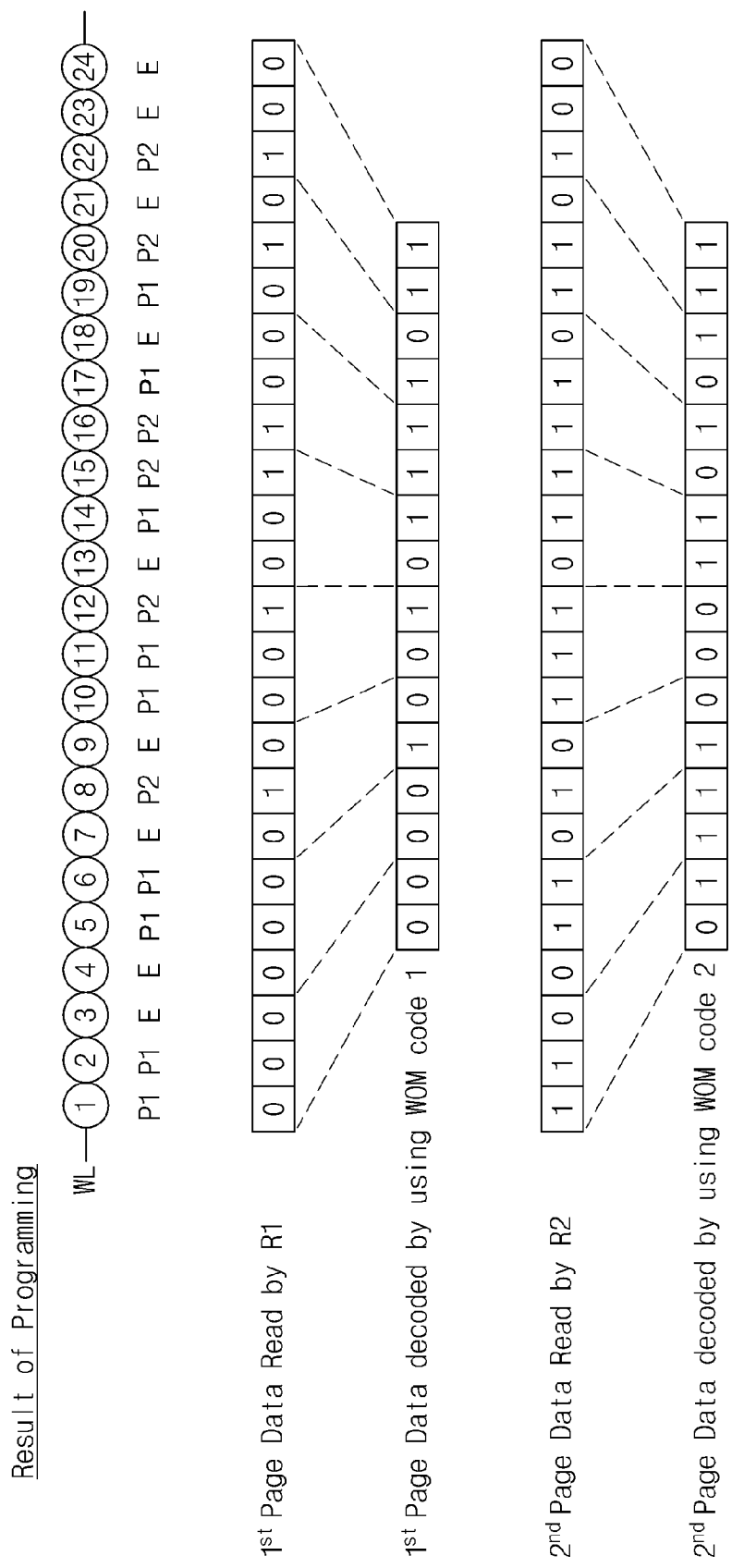
FIG. 15 is a drawing illustrating an embodiment for a read operation in accordance with a coding method and a mapping method illustrated in FIG. 12.

FIG. 15 is a drawing illustrating an embodiment for a read operation in accordance with a coding method and a mapping method illustrated in FIG. 12. In FIG. 15, for explanation purposes, it will be assumed that twenty four memory cells 1~24 are programmed in states of "P1-P1-E-E-P1-P1-E-P2-E-P1-P1-P2-E-P1-P2-P2-P1-E-P1-P2-E-P2-E-E".

A first page data group read operation is as follows. If the first page data group read operation is performed on the twenty four memory cells 1~24 using the first read voltage R1, 24 bit data read from the nonvolatile memory device 100 become "000000010001001100010100". The code circuit 240 decodes the read 24 bit page data group to "0000100101111011" using the first WOM. The decoded "0000100101111011" of 16 bit becomes the read first page data group. As is illustrated in FIGS. 14 and 15, during the first page data group read operation, the program states E and P1 may be treated in the same manner since both are below the first read voltage R1.

A second page data group read operation is as follows. If the second page data group read operation is performed on the twenty four memory cells 1~24 using the second read voltage R2, 24 bit data read from the nonvolatile memory device 100 become "110011010111011110110100". The code circuit 240 decodes the read 24 bit page data group to "0111100011010111" using the second WOM. The decoded "0111100011010111" of 16 bit becomes the read second page data group. As is illustrated in FIGS. 14 and 15, during the second page data group read operation, the program states P1 and P2 may be treated in the same manner since both are above the second read voltage R2. Further, during the second page data group read operation, when the WOM code corresponding to the state map of a code unit is a $1^{st}$ WOM code, the state the encoded data corresponding to the state map is determined in accordance with the 1st WOM code instead of the 2nd WOM code.

For example, reading the code unit including cells 7, 8 and 9 using the second read voltage R2 would produce the code '010', because the state 'E' is lower than the second read voltage R2, and the state P2 is higher than the second read voltage R2. As is illustrated by the tables in FIG. 12, the code '010' is not a $2^{nd}$ WOM code. The code '010' is a $1^{st}$ WOM code. Accordingly, during the second page data group read operation, the code '010' corresponding to states 7, 8 and 9 is decoded in accordance with the $1^{st}$ WOM code to be the decoded data '10', as is illustrated in FIG. 15. The same can be seen in FIG. 15 with respect to the code unit including cells 22, 23 and 24.

The read operation in accordance with some embodiments of the inventive concepts can perform a page data group read operation by a single level.

The nonvolatile memory device 100 of the inventive concepts may be a vertical NAND flash memory (VNAND).

Figure 16:
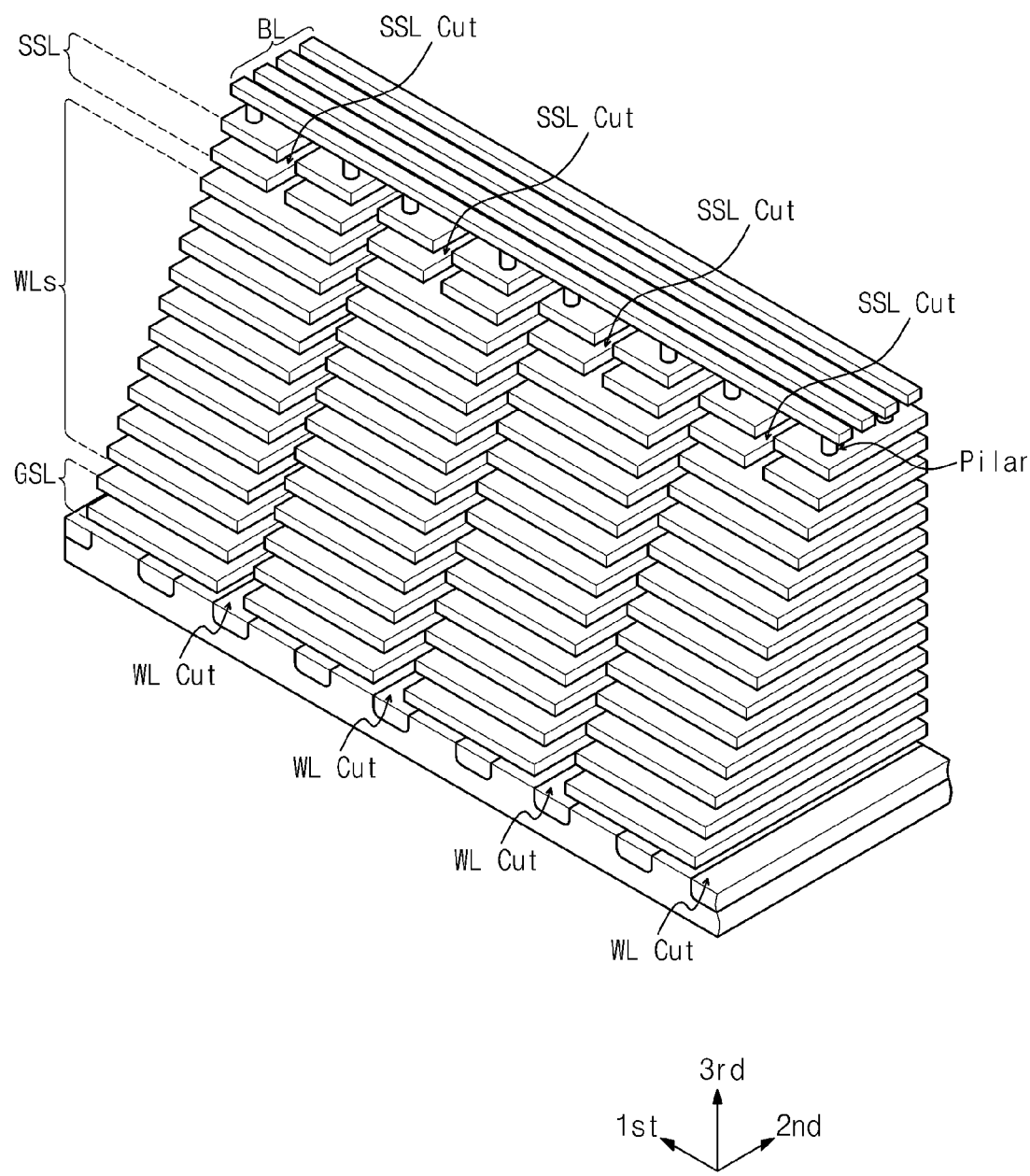
FIG. 16 is a drawing illustrating any one block of a VNAND in accordance with some embodiments of the inventive concepts.

FIG. 16 is a drawing illustrating any one block of a VNAND in accordance with some embodiments of the inventive concepts. Referring to FIG. 16, four sub blocks are formed on a substrate. Each sub block is formed by stacking at least one ground select line GSL, a plurality of word lines WLs and at least one string select line SSL between word line cuts on the substrate. The string select line SSL is divided by a string select line cut. Although not illustrated in the drawing, each word line cut includes a common source line CSL. The common source line included in each word line cut is connected in common. A pillar connected to a bit line penetrates at least one ground select line GSL, a plurality of word lines WLs and at least one string select line SSL to form a string.

In FIG. 16, an object between word line cuts is illustrated as a sub block but the inventive concepts does not need to be limited to this example. The inventive concepts can name an object between a word line cut and a string select line cut a sub block.

The block in accordance with some embodiments of the inventive concepts can be embodied by a structure in which two word lines are merged into one, that is, a merged word line structure.

FIGS. 17A through 17D are drawings illustrating application examples according to at least some example embodiments of the inventive concepts.

Some embodiments of inventive concepts can be applied to a solid state drive (SSD).

Figure 17A:
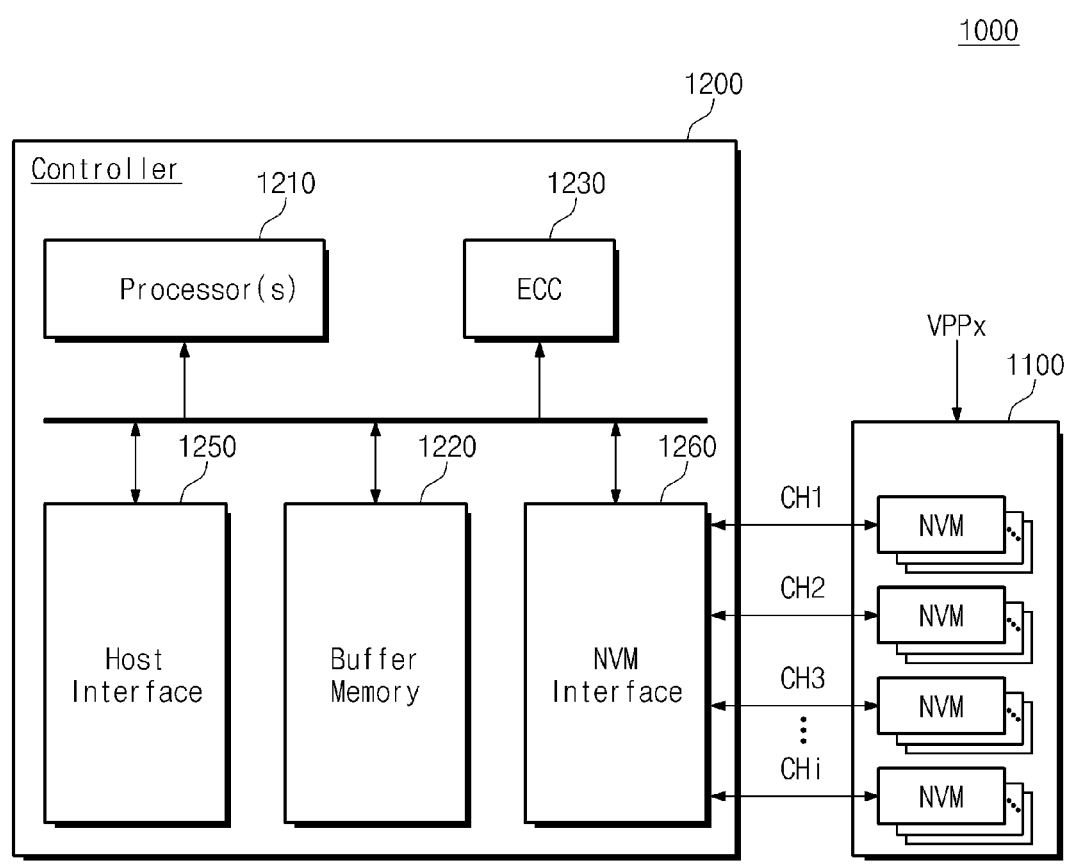
FIGS. 17A through 17D are drawings illustrating application examples of the inventive concepts.

FIG. 17A is a block diagram illustrating a SSD in accordance with some embodiments of the inventive concepts. Referring to FIG. 17A, a SSD 1000 includes a plurality of nonvolatile memory devices 1100 and a SSD controller 1200. The SSD 1000 can perform a multi page program operation for a write-once memory (WOM) and one page read operation by a single level for example, in any of the manners discussed above with reference to FIGS. 1-16.

The nonvolatile memory devices 1100 can be optionally provided with an external high voltage Vpp. The SSD controller 1200 is connected to the nonvolatile memory devices 1100 through a plurality of channels CH1~CH4. The SSD controller 1200 includes at least one processor 1210, a buffer memory 1220, an error correction circuit 1230, a host interface 1250 and a nonvolatile memory interface 1260. The SSD controller 1200 can perform the same structure and function as the memory controller 200 illustrated in FIG. 2.

Since the SSD 1000 is a WOM embodied by a multi page program operation, the number of bits being stored per cell increases and read performance can be greatly improved by performing a page read operation by a single level.

Some embodiments of the inventive concepts can be applied to an embedded multimedia card (eMMC), a moviNAND, and iNAND.

Figure 17B:
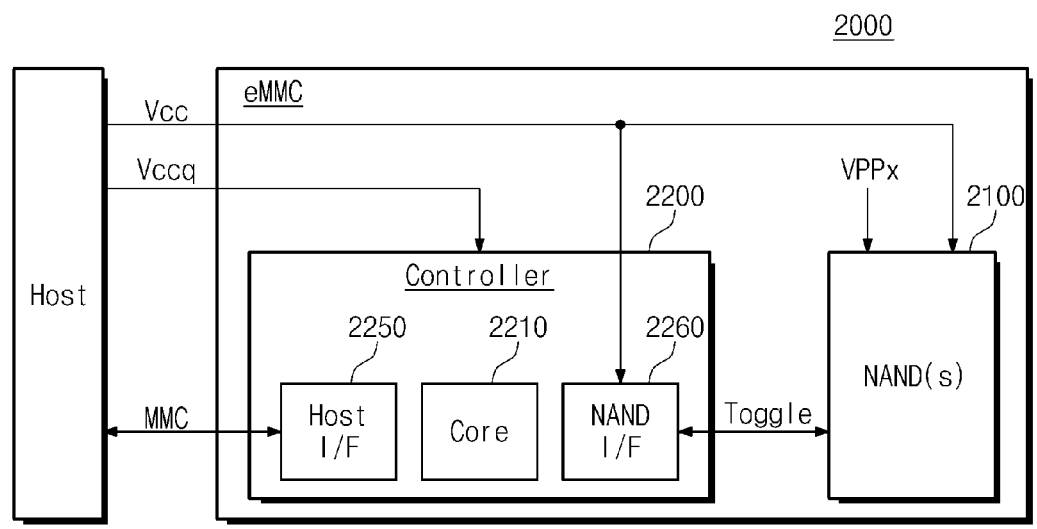

FIG. 17B is a block diagram illustrating an eMMC in accordance with some embodiments of the inventive concepts. Referring to FIG. 17B, the eMMC 2000 may include at least one NAND flash memory device 2100 and a controller 2200.

The NAND flash memory device 2100 may be a single data rate (SDR) NAND or a double data rate (DDR) NAND. The controller 2200 is connected to the NAND flash memory device 2100 through a plurality of channels. The controller 2200 includes at least one controller core 2210, a host interface 2250 and a NAND interface 2260. The controller core 2210 controls the whole operation of the eMMC 2000. The host interface 2250 performs an interface between the controller 2200 and a host. The NAND interface 2260 performs an interface between the NAND flash memory device 2100 and the controller 2200. The host interface 2250 may be a parallel interface (e.g., MMC interface). In another embodiment, the host interface 2250 may be a serial interface (e.g., UHS-II, UFS interface). The controller 220 can be embodied by the memory controller 200 illustrated in FIG. 1.

The eMMC 2000 is provided with supply voltages (Vcc, Vccq) from a host. A first supply voltage Vcc (e.g., 3.3V) is provided to the NAND flash memory device 2100 and the NAND interface 2230. A second supply voltage Vccq (e.g., 1.8V/3.3V) is provided to the controller 2200. The eMMC 2000 can be optionally provided with an external high voltage Vpp.

The eMMC 2000 can improve reliability of data by using the WOM for example, in any of the manners discussed above with reference to FIGS. 1-16.

The inventive concepts can be applied to a universal flash storage (UFS).

Figure 17C:
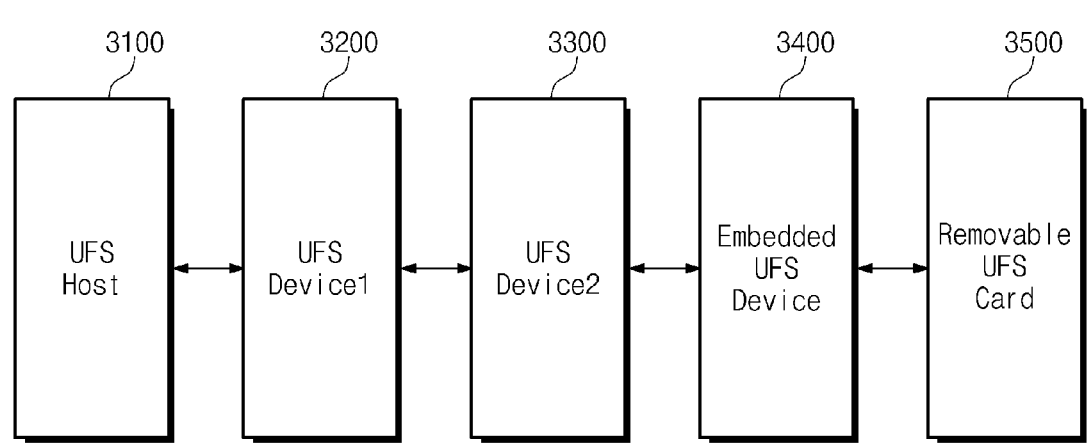

FIG. 17C is a block diagram illustrating a universal flash storage (UFS) system in accordance with some embodiments of the inventive concepts. Referring to FIG. 17C, the UFS system 3000 may include a UFS host 3100, UFS devices 3200 and 3300, an embedded UFS device 3400 and a removable UFS card 3500. The UFS host 3100 may be an application processor of a mobile device. Each of the UFS host 3100, the UFS devices 3200 and 3300, the embedded UFS device 3400 and the removable UFS card 3500 can communicate with external devices by UFS protocols. At least one of the UFS devices 3200 and 3300, the embedded UFS device 3400 and the removable UFS card 3500 can be embodied by the storage device 10 illustrated in FIG. 2.

The embedded UFS device 3400 and the removable UFS card 3500 can communicate by different protocol from the UFS protocol. The embedded UFS device 3400 and the removable UFS card 3500 can communicate by various card protocols (e.g., UFDs, MMC, SD (secure digital), miniSD, Micro SD). The UFS system 3000 perform a multi page program operation for a write-once memory (WOM) and one page read operation by a single level for example, in any of the manners discussed above with reference to FIGS. 1-16.

The inventive concepts can be applied to a mobile device.

Figure 17D:
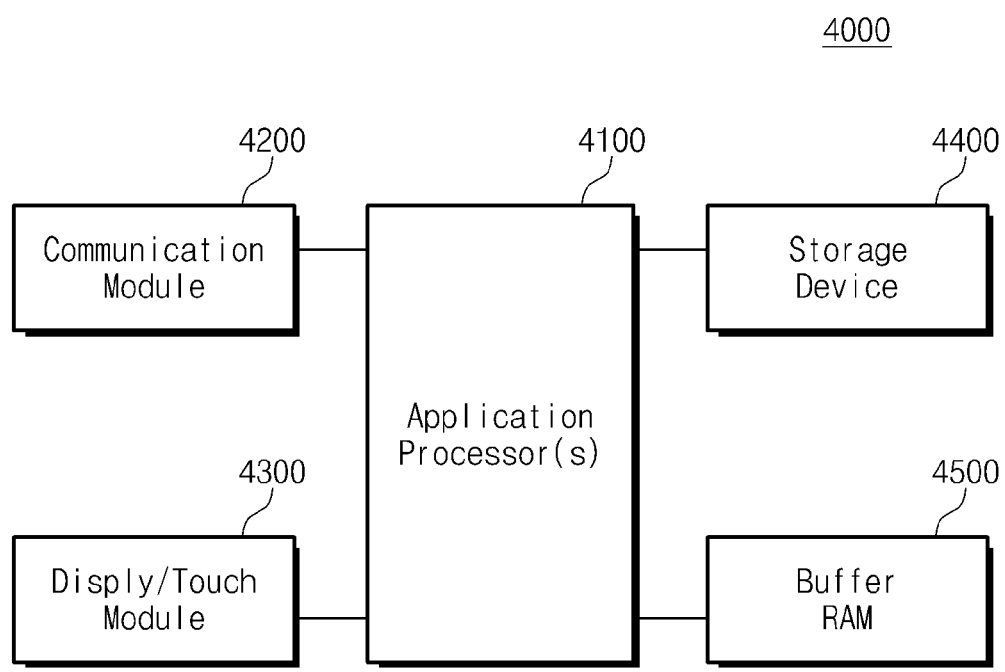

FIG. 17D is a block diagram illustrating a mobile device 4000 in accordance with some embodiments of the inventive concepts. Referring to FIG. 17D, the mobile device 4000 includes an application processor 4100, a communication module 4200, a display/touch module 4300, a storage device 4400 and a mobile RAM 4500.

The application processor 4100 controls the whole operation of the mobile device 4000. The communication module 4200 is embodied to control a wired/wireless communication with an external device. The display/touch module 4300 displays data processed by the application processor 4100 or receives data from a touch panel. The storage device 4400 stores user data. The storage device 4400 may be an eMMC, a SSD and a UFS device.

The mobile device 4000 can improve system performance by including the storage device 4400 improving read operation performance. The mobile device 4000 perform a multi page program operation for a write-once memory (WOM) and one page read operation by a single level for example, in any of the manners discussed above with reference to FIGS. 1-16.

The memory system or the storage device in accordance with some embodiments of the inventive concepts can be mounted using various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

As described above, the storage device in accordance with the inventive concepts can improve read performance by performing a page read operation on multi level cells by a single level.

Example embodiments having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A write method of a storage device including at least one nonvolatile memory device and a memory controller controlling the nonvolatile memory device, the method comprising:
dividing write data into a plurality of page data groups, each page data group including multiple bits of data;
encoding the divided page data groups using different binary codes, respectively;
mapping the encoded page data groups by, for each of the encoded page data groups,
  mapping binary values of the encoded page data group to two programming states, respectively, the two programming states corresponding to the binary code used to encode the encoded page data group; and
programming, in first memory cells connected to one word line, the programming states to which the binary values of each of the mapped encoded page data groups are mapped, such that,
the plurality of page data groups correspond respectively to a plurality of read voltage levels, and
for each of the plurality of page data groups,
  the page data group can be read by performing a single read operation on the first memory cells using the read voltage level corresponding to the page data group.

2. The write method of claim 1, further comprising:
calculating an error correction code value corresponding to each of the divided page data groups; and
adding the calculated error correction code value to each of the divided page data groups.

3. The write method of claim 1, wherein each of the memory cells is programmed to any one of a plurality of programming states,
wherein any one of the two programming states is the lowest state among the plurality of programming states, and
wherein the other of the two programming states is not a highest state among the plurality of programming states.

4. The write method of claim 3, wherein the mapping the binary values to the programming states comprises:
mapping, when a first binary value of any one page data group and a second binary value of another page data group which are to be programmed in one memory cell are identical to each other, the first binary value and the second binary value to a higher state between a first state corresponding to the first binary value and a second state corresponding to the second binary value.

5. The write method of claim 3, wherein the plurality of programming states includes an erase state, a first program state higher than the erase state, and a second program state higher than the first program state.

6. The write method of claim 5, wherein the encoding the divided page data groups further comprises:
first-encoding the page data units "00", "01", "10", and "11" of a first page data group to the encoded page data units "000", "001", "010" and "100", respectively, using a first binary code; and
second-encoding the page data units "00", "01", "10", and "11" of a second page data group to the encoded page data units "111", "110", "101" and "011", respectively, using a second binary code.

7. The write method of claim 6, wherein the mapping the binary values to the programming states comprises:
first-mapping a binary '0' to the erase state and a binary '1' to the second program state with respect to the first-encoded page data group; and
second-mapping a binary '0' to the erase state and a binary '1' to the first program state with respect to the second-encoded page data group.

8. The write method of claim 1, wherein the programming the programming states includes programming the page data groups simultaneously.

9. The write method of claim 1, wherein the programming the programming states includes programming the page data groups according to a desired order.

10. The write method of claim 1, wherein the different binary codes are write-once memory (WOM) codes.

11. The write method of claim 10, wherein the programming the programming states includes programming cells included in at least a part of the nonvolatile memory device designated as a WOM part of the nonvolatile memory device.

12. A read method of a storage device including at least one nonvolatile memory device and a memory controller controlling the nonvolatile memory device comprising:
reading data from a plurality of memory cells connected to one word line by using a single read voltage level in the nonvolatile memory device, wherein the plurality of memory cells store a plurality of page data groups as a result of a multi bit programming operation corresponding to different binary codes, the multi bit programming operation having been performed on each of a plurality of code units, each code unit including multiple memory cells from among the plurality of memory cells, each code unit including different memory cells;
decoding the read data using a binary code, from among the different binary codes, that corresponds to the single read voltage level; and
outputting the decoded data as one of the plurality of page data groups in the memory controller.

13. The read method of claim 12, further comprising:
performing a demapping operation by demapping, to encoded page data units, programming states corresponding to the read data, the encoded page data units including binary values, the demapping operation being performed based on the single read voltage level.

14. The read method of claim 12, wherein the read data includes an error correction code, the method of further comprising:
correcting an error of the decoded data using the error correction code.

15. The read method of claim 12, wherein a number of memory cells included in each of the plurality of code units is three memory cells, wherein, for each of the plurality of code units, the three memory cells included in the code unit have programming states corresponding to two different 2-bit programming operations, the programming states being any one of an erase state, a first program state higher than the erase state and a second program state higher than the first program state, and wherein the plurality of page data groups includes first and second page data groups.

16. The read method of claim 15, further comprising:
reading the first page data group on the basis of a first read voltage between the first program state and the second program state.

17. The read method of claim 15, wherein the reading data from the memory cells further comprises:
reading the second page data group on the basis of a second read voltage between the erase state and the first program state.

18. A storage device comprising:
at least one nonvolatile memory device including a plurality of memory cells; and
a memory controller configured to,
perform a write operation by performing a multi-page program operation on first memory cells, from among the plurality of memory cells, connected to one word line, and
perform a read operation by controlling the at least one nonvolatile memory device to perform a page read operation on any one of at least two different pages by using a single read voltage level,
the write operation being performed such that,
each of the first memory cells holds a programming state, from among a plurality of programming states, that corresponds to a portion of each of the at least two different pages of data simultaneously,
the at least two different pages of data correspond to at least two different single read voltages, respectively, and
for each of the at least two different pages of data, the page of data can be read using the single read voltage to which the page of data corresponds.

19. The storage device of claim 18, wherein the memory controller further comprises:
an error correction circuit configured to,
generate an error correction code value of write data when the write operation is performed, and
correct an error using an error correction code of read data when the read operation is performed.

20. The storage device of claim 18, wherein the memory controller further comprises:
a code circuit, wherein the code circuit comprises:
a binary encoder configured to encode write data using a binary code when the write operation is performed;
a binary decoder configured to decode read data using the binary code when the read operation is performed;
a state mapper configured to map binary values of the encoded write data to two programming states, among the plurality of programming states, that correspond to the single read voltage level; and
a state demapper configured to demap data read according to the read operation to binary values corresponding to the two programming states,
wherein the demapped data equals the read data.

* * * * *